US010734397B2

(12) United States Patent
Zhou et al.

(10) Patent No.: US 10,734,397 B2
(45) Date of Patent: Aug. 4, 2020

(54) THREE-DIMENSIONAL MEMORY DEVICES AND FABRICATING METHODS THEREOF

(71) Applicant: Yangtze Memory Technologies Co., Ltd., Wuhan, Hubei (CN)

(72) Inventors: Cheng Zhou, Hubei (CN); Bin Yuan, Hubei (CN); QingBo Liu, Hubei (CN); Song Man Xu, Hubei (CN); Siying Liu, Hubei (CN); Rui Gong, Hubei (CN); Zhiguo Zhao, Hubei (CN); Zhaoyun Tang, Hubei (CN); Zhiliang Xia, Hubei (CN); Zongliang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/126,433

(22) Filed: Sep. 10, 2018

(65) Prior Publication Data
US 2019/0081055 A1    Mar. 14, 2019

Related U.S. Application Data

(63) Continuation of application No. PCT/CN2018/096103, filed on Jul. 18, 2018.

(30) Foreign Application Priority Data

Aug. 31, 2017    (CN) .......................... 2017 1 0770822

(51) Int. Cl.
*H01L 27/11556*    (2017.01)
*H01L 27/11524*    (2017.01)
(Continued)

(52) U.S. Cl.
CPC .. *H01L 27/11556* (2013.01); *H01L 21/28008* (2013.01); *H01L 23/53295* (2013.01);
(Continued)

(58) Field of Classification Search
CPC ......... H01L 27/11556; H01L 27/11524; H01L 27/11548; H01L 23/53295;
(Continued)

(56) References Cited

U.S. PATENT DOCUMENTS 9,502,429 B2 *  11/2016  Hironaga .......... H01L 27/11556
9,711,529 B2     7/2017  Hu et al.
(Continued)

FOREIGN PATENT DOCUMENTS

CN    105448840 A    3/2016
CN    106024786 A    10/2016
(Continued)

OTHER PUBLICATIONS

International Search Report and Written Opinion of the International Searching Authority directed to related International Patent Application No. PCT/CN2018/096103, dated Oct. 17, 2018; 8 pages.
(Continued)

*Primary Examiner* — Syed I Gheyas
(74) *Attorney, Agent, or Firm* — Sterne, Kessler, Goldstein & Fox P.L.L.C.

(57) ABSTRACT

A method for forming a 3D memory device is disclosed. The method includes: forming an first insulating layer on a substrate in a peripheral region, the first insulating layer having a slope near a boundary between the peripheral region and a core region of the substrate; forming an alternating conductive/dielectric stack on the substrate and the slope of the first insulating layer, a lateral portion of the alternating conductive/dielectric stack extending along a top surface of the substrate in the core region, and an inclined portion of the alternating conductive/dielectric stack extending along the slope of the first insulating layer; and forming a plurality of contacts to electrically contact a plurality of
(Continued)

conductive layers in the inclined portion of the alternating conductive/dielectric stack.

11 Claims, 17 Drawing Sheets

(51) Int. Cl.
*H01L 27/11548* (2017.01)
*H01L 23/532* (2006.01)
*H01L 29/417* (2006.01)
*H01L 21/28* (2006.01)
*H01L 27/11531* (2017.01)
*H01L 27/11582* (2017.01)
*H01L 27/11575* (2017.01)

(52) U.S. Cl.
CPC .. *H01L 27/11524* (2013.01); *H01L 27/11531* (2013.01); *H01L 27/11548* (2013.01); *H01L 27/11575* (2013.01); *H01L 27/11582* (2013.01); *H01L 29/41741* (2013.01); *H01L 29/41725* (2013.01)

(58) Field of Classification Search
CPC ......... H01L 29/41741; H01L 21/28008; H01L 27/11531; H01L 27/11575; H01L 27/11582; H01L 27/11551; H01L 27/11578
See application file for complete search history.

(56) References Cited

U.S. PATENT DOCUMENTS

| 9,997,526 | B2 | 6/2018 | Sudo et al. |
| 10,141,372 | B2 | 11/2018 | Park et al. |
| 2011/0018051 | A1 | 1/2011 | Kim et al. |
| 2011/0180941 | A1* | 7/2011 | Hwang ............ H01L 27/11575 257/786 |
| 2012/0135583 | A1 | 5/2012 | Jang et al. |
| 2013/0017629 | A1* | 1/2013 | Pyo ............... H01L 21/306 438/16 |
| 2014/0264898 | A1 | 9/2014 | Hu et al. |
| 2017/0213723 | A1 | 7/2017 | Xiang et al. |
| 2019/0081055 | A1 | 3/2019 | Zhou et al. |

FOREIGN PATENT DOCUMENTS

| CN | 106206447 A | 12/2016 |
| CN | 106992179 A | 7/2017 |
| CN | 107482012 A | 12/2017 |

OTHER PUBLICATIONS

Kim, Jiyoung et al., "A Stacked Memory Device on 3D Technology for Ultra-High-Density Data Storage," Nanotechnology, vol. 22, Jun. 24, 2011; 7 pages.

* cited by examiner

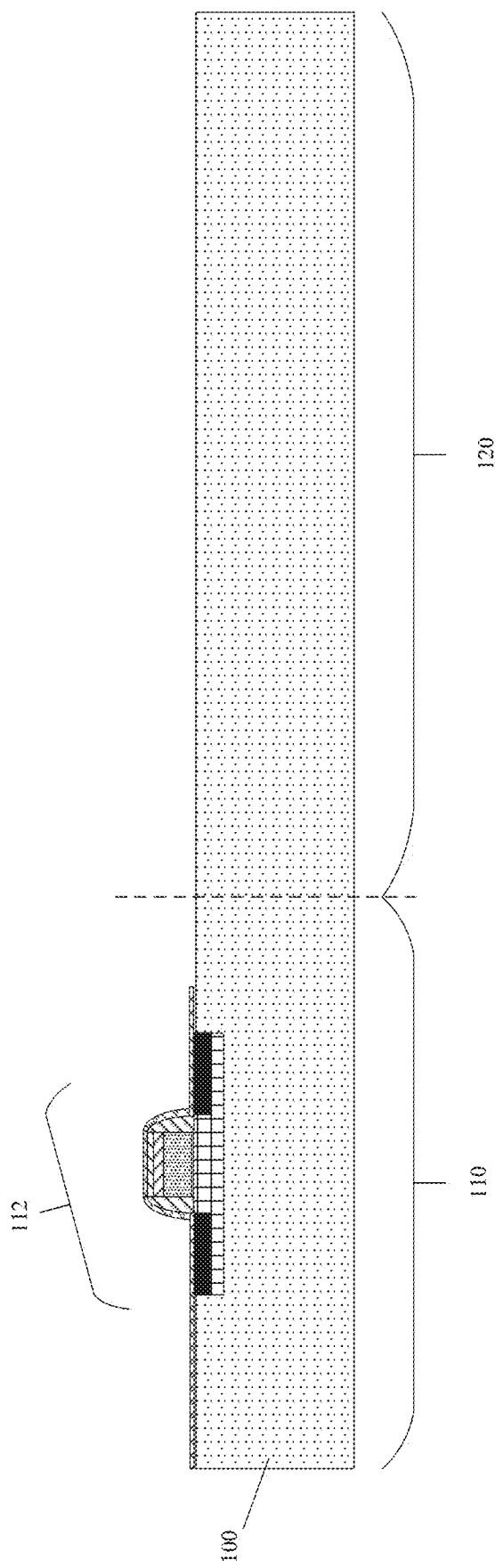

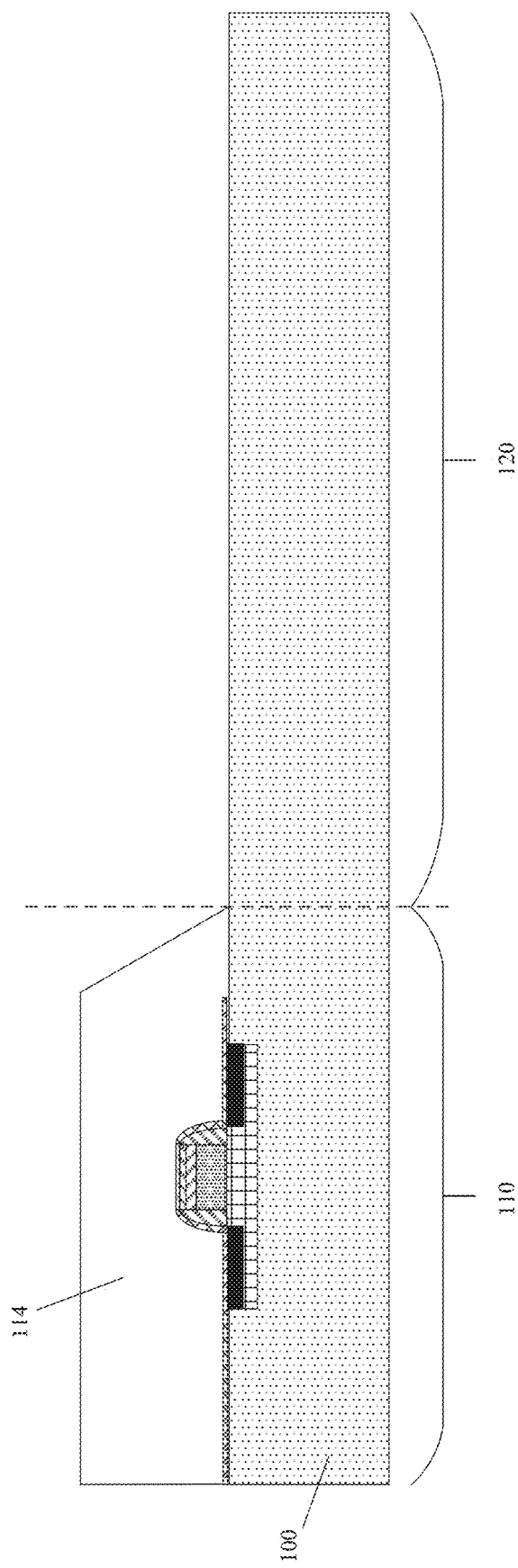

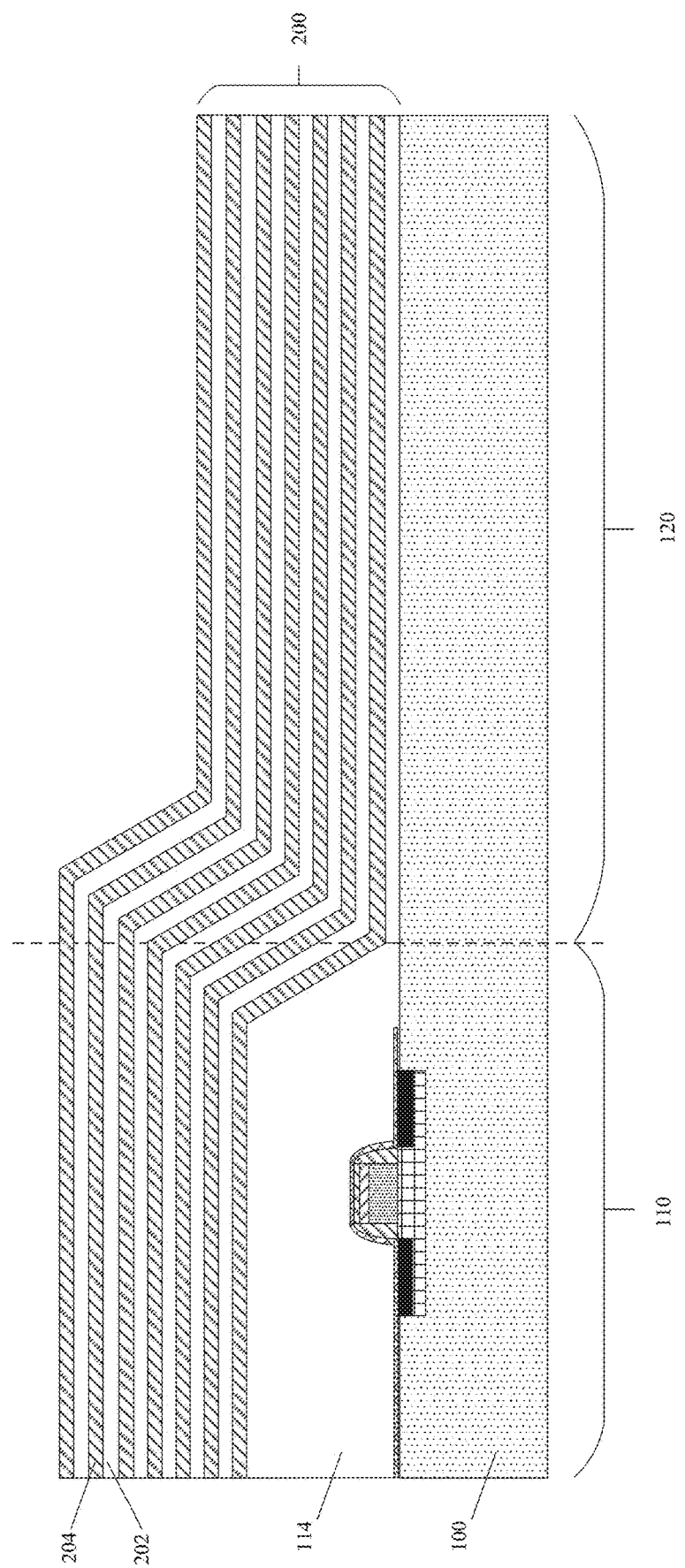

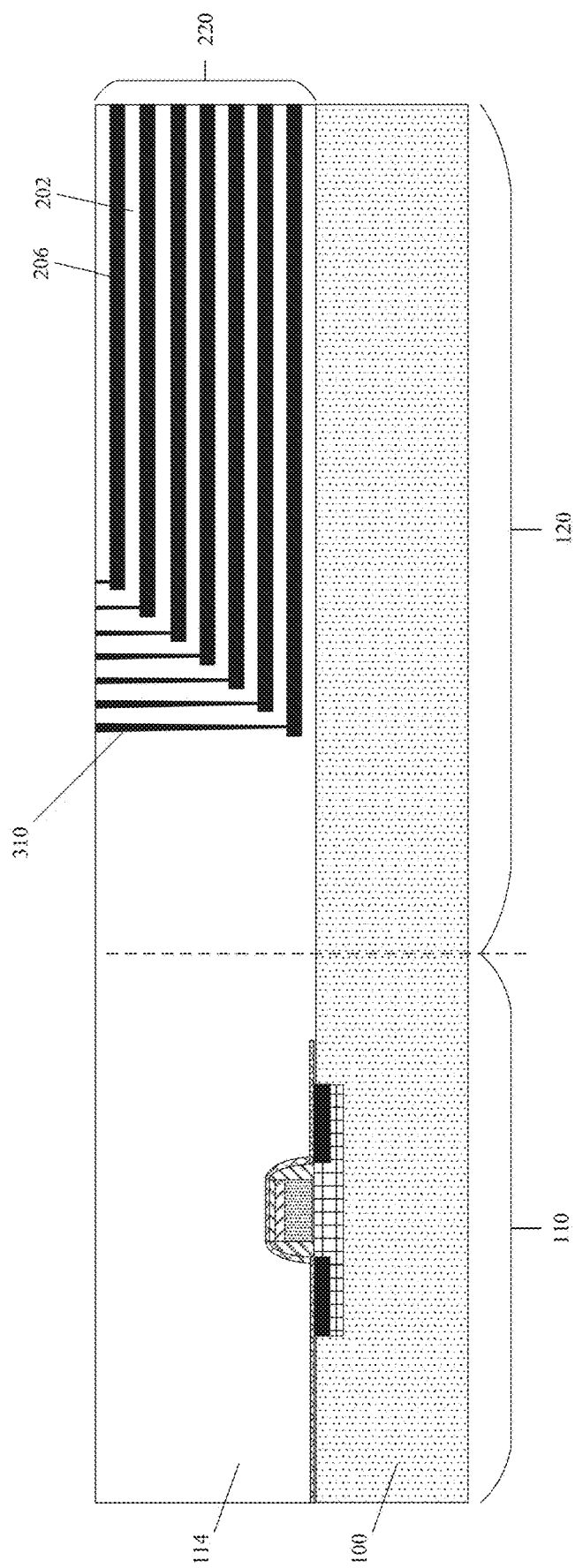

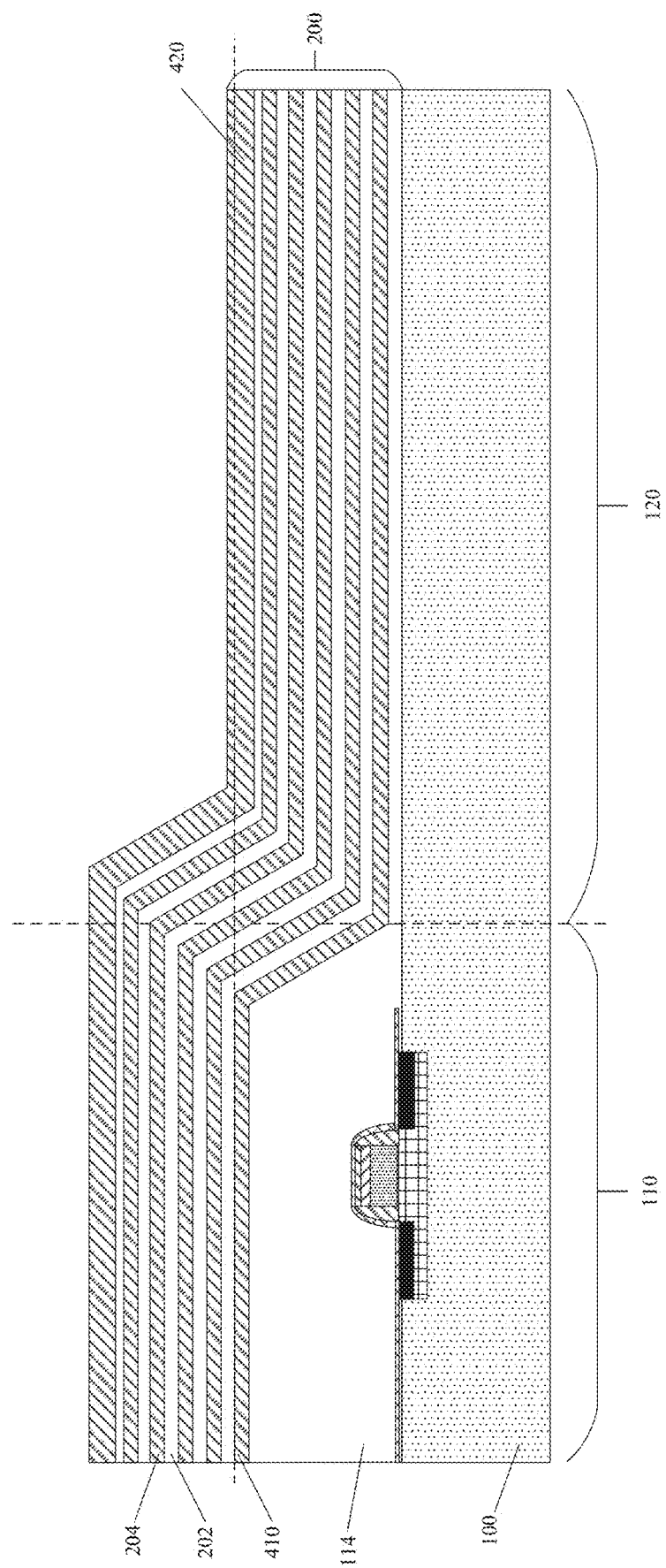

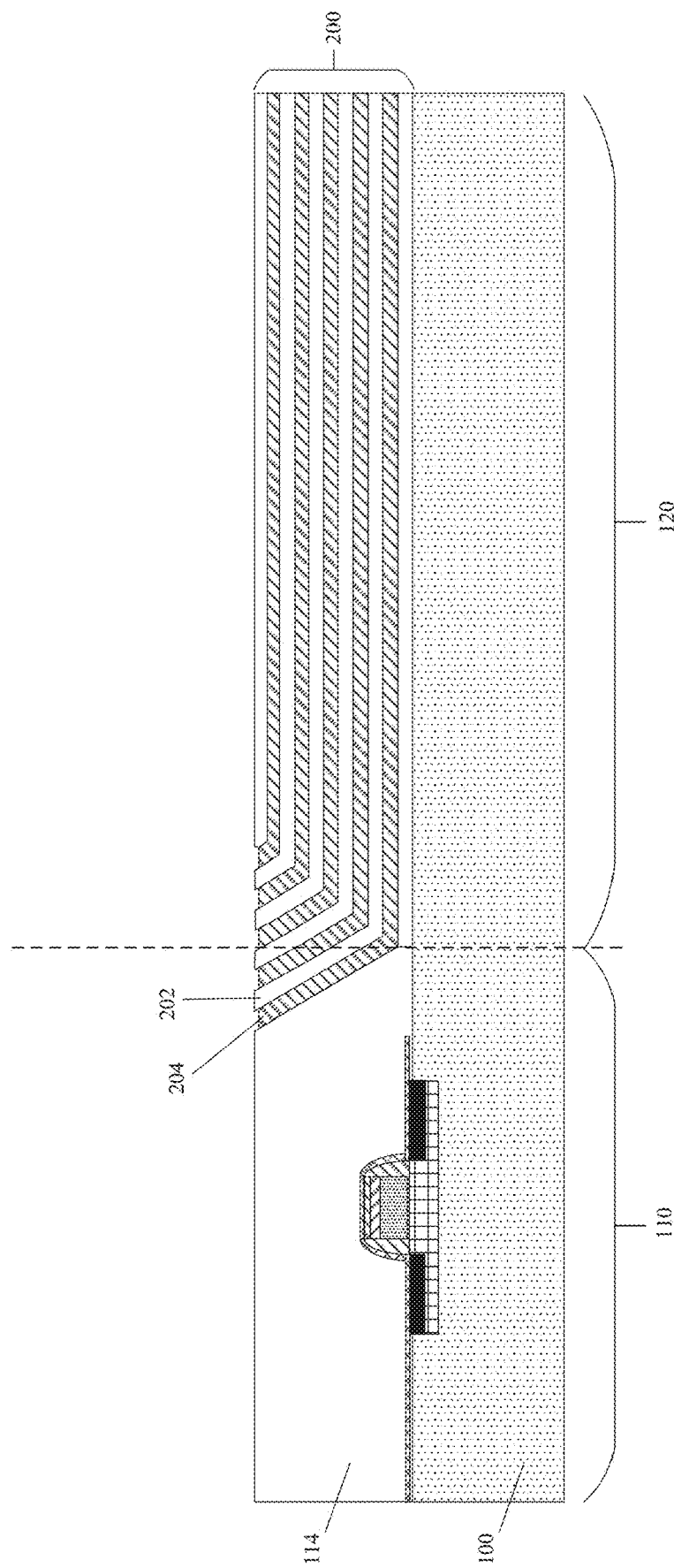

THREE-DIMENSIONAL MEMORY DEVICES AND FABRICATING METHODS THEREOF

CROSS-REFERENCE TO RELATED APPLICATIONS

This application claims priority to PCT/CN2018/096103 filed on Jul. 18, 2018, which claims priority to Chinese Patent Application No. 201710770822.1, filed on Aug. 31, 2017, the entire contents of which are incorporated herein by reference.

TECHNICAL FIELD

The present disclosure generally relates to the field of semiconductor technology, and more particularly, to a three-dimensional (3D) memory device and a fabricating method thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. The staircase structure in the 3D NAND memory device is also referred to as a gate stack, which needs to be connected to an external circuit through multiple metal lines for implementing a memory function. Since the number of steps in the staircase structure keeps increasing, it is a challenge to control the size of the steps in the staircase structure during the existing fabricating processes, which may cause many problems, such as the leakage problem of the connection between the metal lines and the gate stack, the breakdown problem of the gate stack, etc.

BRIEF SUMMARY

Embodiments of a method for forming a three-dimensional (3D) memory devices are disclosed herein. The method comprises: forming an first insulating layer on a substrate in a peripheral region, the first insulating layer having a slope near a boundary between the peripheral region and a core region of the substrate; forming an alternating conductive/dielectric stack on the substrate and the slope of the first insulating layer, a lateral portion of the alternating conductive/dielectric stack extending along a top surface of the substrate in the core region, and an inclined portion of the alternating conductive/dielectric stack extending along the slope of the first insulating layer; and forming a plurality of contacts to electrically contact a plurality of conductive layers in the inclined portion of the alternating conductive/dielectric stack.

The method further comprises: before forming the first insulating layer, forming a metal-oxide-semiconductor field-effect transistor on the substrate in the peripheral region; wherein forming the first insulating layer includes forming the first insulating layer to cover the metal-oxide-semiconductor field-effect transistor.

In some embodiments, forming the first insulating layer comprises: forming the first insulating layer on the substrate in both the peripheral region and the core region; and removing a portion of the first insulating layer in the core region, such that the remaining portion of the first insulating layer in the peripheral region has the slope near the boundary between the peripheral region and the core region.

In some embodiments, forming the first insulating layer comprises: forming the first insulating layer having a slope with a slant angle in a range from about 30 degrees to about 90 degrees.

In some embodiments, forming the alternating conductive/dielectric stack comprises: forming an alternating dielectric stack on the substrate and the first insulating layer, the alternating dielectric stack including a first lateral portion on the substrate in the core region, a second lateral portion on a top surface of the first insulating layer in the peripheral region, and an inclined portion on the slope of the first insulating layer near the boundary between the peripheral region and the core region; removing the second lateral portion of the alternating dielectric stack; planarizing a top surface of the inclined portion of the alternating dielectric stack, such that the top surfaces of the first insulating layer, the inclined portion of the alternating dielectric stack, and the first lateral portion of the alternating dielectric stack are co-planar; and converting remaining portions of the alternating dielectric stack to the alternating conductive/dielectric stack.

In some embodiments, forming the alternating dielectric stack comprises: forming at least 32 dielectric layer pairs stacked in a vertical direction above the substrate, each dielectric layer pair including a first dielectric layer and a second dielectric layer that has a material different with the first dielectric layer.

In some embodiments, forming the alternating dielectric stack comprises: forming at least 32 dielectric layer pairs stacked in the vertical direction, each dielectric layer pair including a silicon oxide layer and a silicon nitride layer.

In some embodiments, forming the alternating dielectric stack comprises: forming a bottom second dielectric layer on a top surface of the first insulating layer as a first chemical mechanical polishing stop layer in the peripheral region; and forming a top second dielectric layer as a second chemical mechanical polishing stop layer in the core region; wherein the first chemical mechanical polishing stop layer and the second chemical mechanical polishing stop layer are approximately co-planar.

In some embodiments, removing the second lateral portion of the alternating dielectric stack comprises: removing the first dielectric layers and the second dielectric layers of the alternating dielectric stack in the alternating dielectric stack except the bottom second dielectric layer.

In some embodiments, planarizing the top surface of the inclined portion of the alternating dielectric stack comprises: removing an upper portion of the inclined portion of the alternating dielectric stack that is higher than a top surface of the first chemical mechanical polishing layer or the second chemical mechanical polishing stop layer.

In some embodiments, converting remaining portions of the alternating dielectric stack to the alternating conductive/dielectric stack comprises: replacing the second dielectric layers in the alternating dielectric stack with conductive layers.

In some embodiments, forming the plurality of contacts comprises: forming a second insulating layer in both the peripheral region and the core region to cover a top surface of the alternating conductive/dielectric stack; and forming a plurality of contacts in the second insulating layer to electrically contact with the plurality of conductive layers in the inclined portion of the alternating conductive/dielectric stack; wherein the plurality of contacts have a same height.

In some embodiments, forming the plurality of contacts comprises: forming a plurality of through holes in the second insulating layer in a single etching process; and depositing a conductive material into the plurality of through holes to form the plurality of contacts.

In some embodiments, the method further comprises: forming two contacts in the first and second insulating layers to electrically contact a source electrode and a drain electrode of the metal-oxide-semiconductor field-effect transistor respectively.

Another aspect of the present disclosure provides a three-dimensional (3D) memory device, comprising: an insulating layer on a substrate in a peripheral region, the insulating layer having a slope near a boundary between the peripheral region and a core region of the substrate; an alternating conductive/dielectric stack on the substrate and the slope of the insulating layer, a lateral portion of the alternating conductive/dielectric stack extending along a top surface of the substrate in the core region, and an inclined portion of the alternating conductive/dielectric stack extending along the slope of the insulating layer; and a plurality of contacts in electrical contact with a plurality of conductive layers in the inclined portion of the alternating conductive/dielectric stack.

The device further comprises: a metal-oxide-semiconductor field-effect transistor on the substrate in the peripheral region, wherein the insulating layer covers the metal-oxide-semiconductor field-effect transistor; and two contacts in the insulating layer and in electrical contact with a source electrode and a drain electrode of the metal-oxide-semiconductor field-effect transistor respectively.

In some embodiments, a slant angle of the slope of the insulating layer is in a range from about 30 degrees to about 90 degrees.

In some embodiments, the alternating conductive/dielectric stack comprises: at least 32 conductive/dielectric layer pairs, each including a dielectric layer and a conductive layer.

In some embodiments, a top surface of the lateral portion of the alternating conductive/dielectric stack is co-planar with a top surface of the inclined portion of the alternating conductive/dielectric stack.

In some embodiments, the plurality of contacts have a same height and are formed in a same process.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 1A-1F illustrate cross-sectional views of an exemplary 3D memory device at certain fabricating stages of a fabricating method;

FIGS. 4A-4H illustrate cross-sectional views of an exemplary 3D memory device at certain fabricating stages of the method shown in FIG. 3.

Figure 1B:
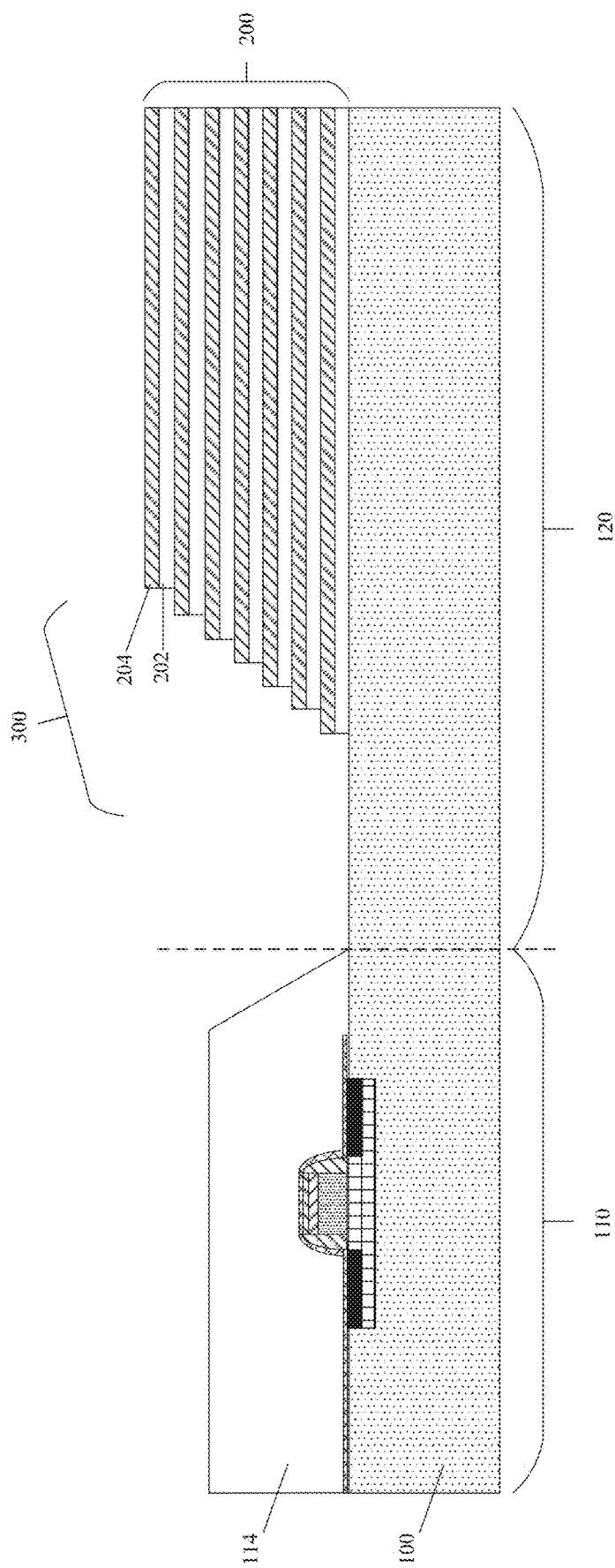

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

FIGS. 1A-1F illustrate cross-sectional views of an exemplary 3D memory device at certain fabricating stages of a fabricating method. The fabricating method includes the following operations.

As shown in FIG. 1A, a substrate 100 can be provided. In some embodiments, substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc.

In some embodiments, substrate 100 can be divided into a peripheral region 110 and a core region 120. Peripheral region 110 can be on the side of core region 120. As shown in FIG. 1A, in some embodiments, a metal-oxide-semiconductor field-effect transistor (MOSFET) 112 can be formed on substrate 100 in peripheral region 110.

As shown in FIG. 1B, an insulating layer 114 can be formed on substrate 100 in peripheral region 110 to cover MOSFET 112. In some embodiments, insulating layer 114 can include any suitable insulating material and/or dielectric material, such as silicon oxide, etc. In some embodiments, an oxide layer can be deposited on substrate 100 to cover MOSFET 112. A portion of the oxide layer in core region 120 can be etched and removed. The remaining portion of the oxide layer in peripheral region 110 forms insulating layer 114. In some embodiments, insulating layer 114 at the boundary of peripheral region 110 that is adjacent to core region 120 can have a slope.

As shown in FIG. 1C, an alternating dielectric stack 200 including a plurality of dielectric layer pairs can be formed on substrate 100 and insulating layer 114. Alternating dielectric stack 200 can include an alternating stack of a first dielectric layer 202 (e.g., of silicon oxide) and a second dielectric layer 204 (e.g., of silicon nitride) that is different from first dielectric layer. In core region 120, the plurality of first dielectric layers 202 and second dielectric layers 204 are extended in a lateral direction that is parallel to the surface of substrate 100. In peripheral region 110, the plurality of first dielectric layers 202 and second dielectric layers 204 can be extended along the surface of insulating layer 114. That is, at the boundary of peripheral region 110 and core region 120, the plurality of first dielectric layers 202 and second dielectric layers 204 can be inclined and extended along a direction that is parallel to the top surface of the slope of insulating layer 114.

In some embodiments, there are more layers than the dielectric layer pairs made of different materials and with different thicknesses in alternating dielectric stack 200. For example, a bottom layer and a top layer of alternating dielectric stack 200 can be first dielectric layers that have a thickness larger than the thicknesses of other interlayers. Alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, alternating dielectric stack 200 can include a plurality of oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in alternating dielectric stack 200, multiple oxide layers 202 and multiple nitride layers 204 alternate in a vertical direction. In other words, except a top and a bottom layer of a given alternating oxide/nitride stack, each of the other oxide layers 202 can be sandwiched by two adjacent nitride layers 204, and each of nitride layers 204 can be sandwiched by two adjacent oxide layers 202.

Oxide layers 202 can each have the same thickness or have different thicknesses. For example, a thickness of each oxide layer 202 can be in a range from 10 nm to 100 nm, preferably about 30 nm. Similarly, nitride layers 204 can each have the same thickness or have different thicknesses. For example, a thickness of each nitride layer 204 can be in a range from 10 nm to 100 nm, preferably about 35 nm.

It is noted that, in the present disclosure, oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, oxide layers 202 can be silicon oxide layers, and nitride layers 204 can be silicon nitride layer.

Alternating dielectric stack 200 can include any suitable number of layers of oxide layers 202 and nitride layers 204. In some embodiments, a total number of layers of oxide layers 202 and nitride layers 204 in alternating dielectric stack 200 is equal to or larger than 64. That is, a number of oxide/nitride layer pairs can be equal to or larger than 32. In some embodiments, alternating oxide/nitride stack 200 includes more oxide layers or more nitride layers with different materials and/or thicknesses than the oxide/nitride layer pair.

As shown in FIG. 1D, portions of alternating dielectric stack 200 can be removed to form a staircase structure 300 at the edge of alternating dielectric stack 200 in core region 120. In some embodiments, alternating dielectric stack 200 in peripheral region 110 can be removed. Multiple etch-trim processes can be performed repeatedly to form a set of steps. In some embodiments, each step can include a dielectric layer pair. As such, each step can expose a portion of the top surface of one second dielectric layer 204.

In some embodiments, the etch-trim processes can include a set of repeating etch-trim processes to form staircase structure 300 including a set of steps at the edge alternating dielectric stack 200.

Specifically, for forming each step, a photoresist layer (not shown) can be used as a mask to expose a portion of the top surface of alternating dielectric stack 200. For forming the first step, a width of the exposed top surface of alternating dielectric stack 200 can be a step width. In some embodiments, an anisotropic etching process, such as a reactive ion etching (RIE) process, or other suitable dry/wet etching process, can be performed to remove the exposed layer (e.g., second dielectric layer 204) that is exposed through the mask (i.e., the photoresist layer). The etching process can stop on the next lower layer (e.g., first dielectric layer 202). The pattern in the mask (i.e., the photoresist layer) is then transferred to the layer (e.g., second dielectric layer 204) that has been etched. The exposed next lower layers (e.g., first dielectric layers 202) can be then removed by another etching process that stops on the next lower layers (e.g., second dielectric layer 204). As such, the first step can be created on the first two top layers of alternating dielectric stack 200.

Next, the mask (i.e., the photoresist layer) can be reduced in size by removing a portion of the mask (also known as "trimming") above alternating dielectric stack 200, such as by an isotropic etching process, to expose another step width of alternating dielectric stack 200. The method can proceed by subjecting the structure to two anisotropic etching processes, including removing exposed portions of the two exposed layers (e.g., two second dielectric layers 204), and subsequently removing exposed portions of the two exposed next lower layers (e.g., first dielectric layers 202). As such, the first step can be lowered to the third and fourth top layers of alternating dielectric stack 200, and a second step can be created on the first two top layers of alternating dielectric stack 200.

In some embodiments, the successive reduction in size of the mask (i.e., photoresist layer 130) and the two-step etching processes (also referred as etch-trim processes) can be repeated such that staircase structure 300 including a set of steps can be formed on the edge of alternating dielectric stack 200 in core region 120, as shown in FIG. 1D. The photoresist layer can be then removed. In some embodiments, the removal process can include any suitable etching processes and cleaning processes.

Figure 1E:
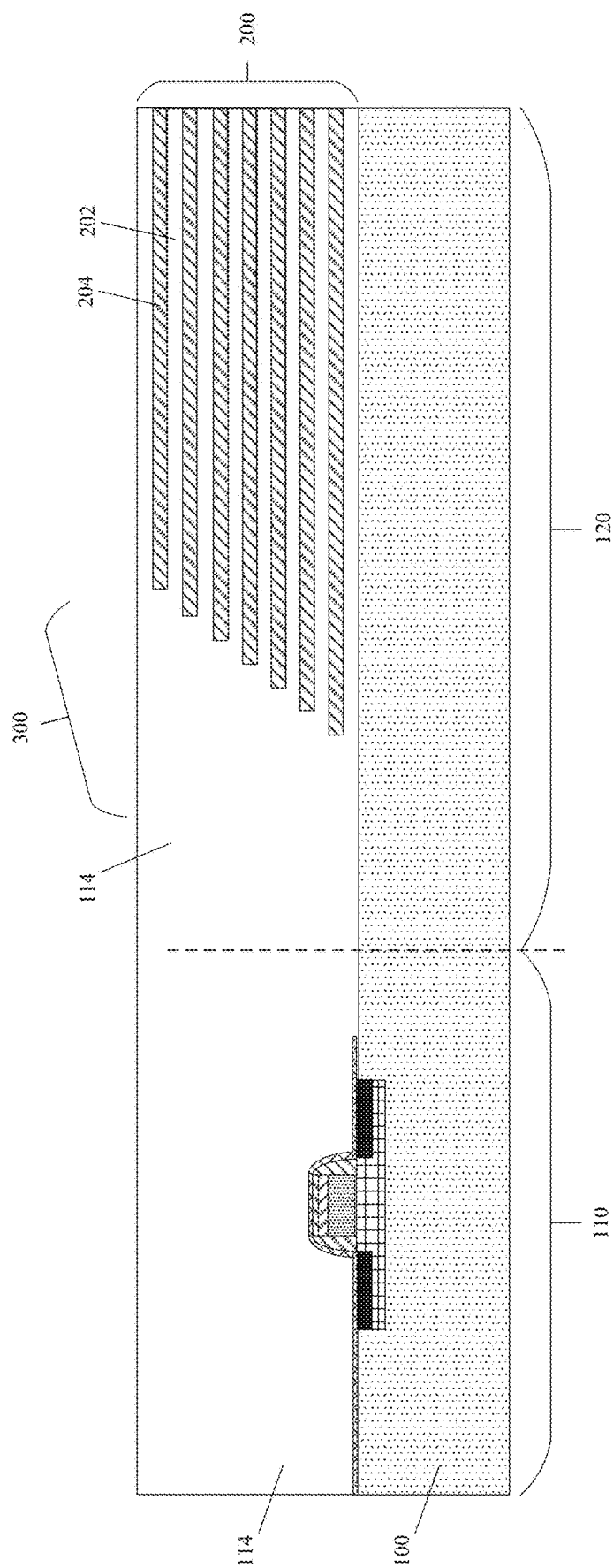

As shown in FIG. 1E, a height of insulating layer 114 can be increased to cover staircase structure 300. In some embodiments, a deposition process can be performed to increase the height of insulating layer 114 in core region 120, such that insulating layer 114 can cover alternating dielectric stack 200 including staircase structure 300. A chemical mechanical polishing (CMP) process can be performed to planarize the top surface of insulating layer 114.

As shown in FIG. 1F, second dielectric layers 204 in alternating dielectric stack 200 can be replaced by conductive layers 206, such that alternating dielectric stack 200 is converted to an alternating conductive/dielectric stack 220. Conductive layers 206 can be used as multiple word lines. Multiple contacts 310 penetrating insulating layer 114 can be formed to electrically contact with conductive layers 206 respectively through staircase structure 300. As such, the multiple word lines can be connected to a wiring layer through multiple contacts 310.

In some embodiments, a gate replacement process (also known as the "word line replacement" process) can be performed to replace second dielectric layers 204 (e.g., silicon nitride) of alternating dielectric stack 200 with conductive layers 206 (e.g., W). As a result, after the gate replacement process, alternating dielectric stack 200 can become an alternating conductive/dielectric stack 220. The replacement of second dielectric layers 204 with conductive layers 206 can be performed by wet etching second dielectric layers 204 (e.g., silicon nitride) selective to first dielectric layers 202 (e.g., silicon oxide) and filling the structure with conductive layers 206 (e.g., W). Conductive layers 206 can be filled by PVD, CVD, ALD, any other suitable process, or any combination thereof. Conductive layers 206 can include any suitable conductive materials including, but not limited to, W, Co, Cu, Al, polysilicon, silicides, or any combination thereof.

In some embodiments, multiple contacts 310 can be formed through insulating layer 114 by first etching multiple vertical through holes (e.g., by wet etching and/or dry etching), followed by filling the through holes with conductive materials using ALD, CVD, PVD, any other suitable processes, or any combination thereof. The conductor materials used to fill the through holes can include, but are not limited to, W, Co, Cu, Al, polysilicon, silicides, or any combination thereof. It is understood that the process for forming multiple contacts 310 can include multiple processes, for example, photolithography, etching, thin film deposition, and CMP, etc.

In some embodiments, the above method for forming the 3D memory device may have some drawbacks. In one aspect, as the number of the layers in alternating conductive/dielectric stack 220 keeping increases, multiple trim-etch processes are required to be performed. Thus, the cost of the multiple photoresist layers and multiple etching processes to form the staircase structure can be higher and higher. For example, to form a 39 levels of staircases, at least 9 photoresist layers are required to be used as the masks.

Figure 2A:
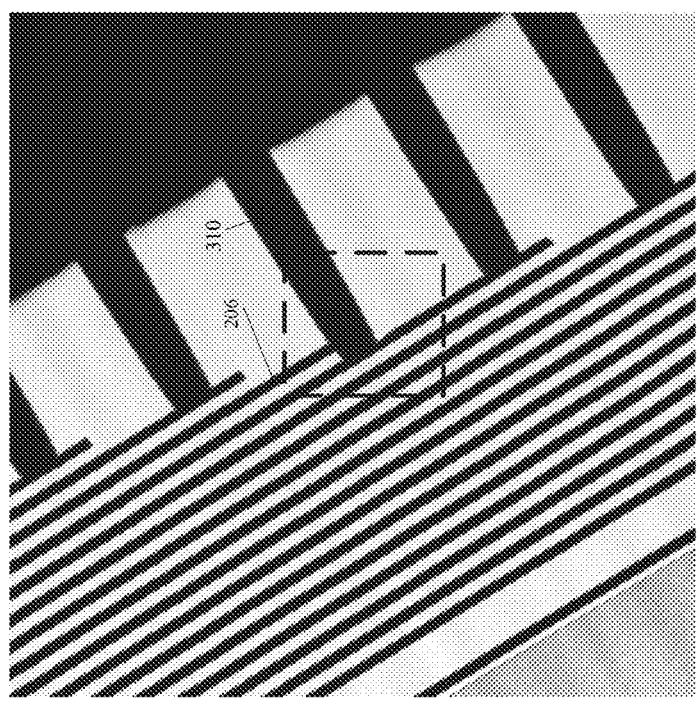
FIG. 2A illustrates a cross-sectional view of an electronic scan diagram of a staircase region of a 3D memory device including a misalignment between a contact and a step.

In another aspect, due to the difficulty in controlling the step size, the step size deviation can cause position deviation of the contact hole in the subsequent etching process. FIG. 2A illustrates a cross-sectional view of an electronic scan diagram of a staircase region of a 3D memory device including a misalignment between a contact and a step. As shown, the misalignment between contact 310 and the step in the dashed box is caused by the step size deviation. Since two contacts 310 are connected to a same step, a gate short problem can be caused and resulting in a word line leakage problem.

Figure 2B:
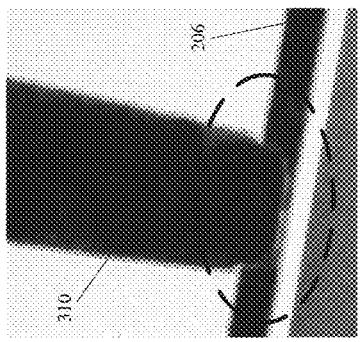
FIG. 2B illustrates a cross-sectional view of an electronic scan diagram of a step perforation in a 3D memory device.

In another aspect, due to the difficulty in controlling the etching depth, the step depth deviation can cause over-etching problem in forming the contact holes. FIG. 2B illustrates a cross-sectional view of an electronic scan diagram of a step perforation in a 3D memory device. As shown in the dashed circular region, a contact 310 penetrates conductive layer 206 due to the over-etching of the contact hole. The step perforation can cause leakage problem or breakdown problem.

Accordingly, various embodiments in accordance with the present disclosure provide a method for forming a 3D memory device. In the disclosed method, an alternating conductive/dielectric stack can include an inclined portion formed on a slope of an insulating layer. The inclined portion of the alternating conductive/dielectric stack can be used to replace the staircase structure. The contacting surfaces of the multiple conductive layers of the alternating conductive/dielectric stack can be at the inclined portion and co-planar with each other. Thus, multiple contacts can be formed in a single process to electronically contact with the multiple conductive layers. Without forming the staircase structure, multiple trim-etch processes are not necessary, the cost of multiple photoresist masks and etching processes can be saved. Moreover, the drawbacks including short problem, leakage problem and breakdown problem caused by the difficulty of controlling the staircase structure fabricating process can be avoided.

Figure 3:
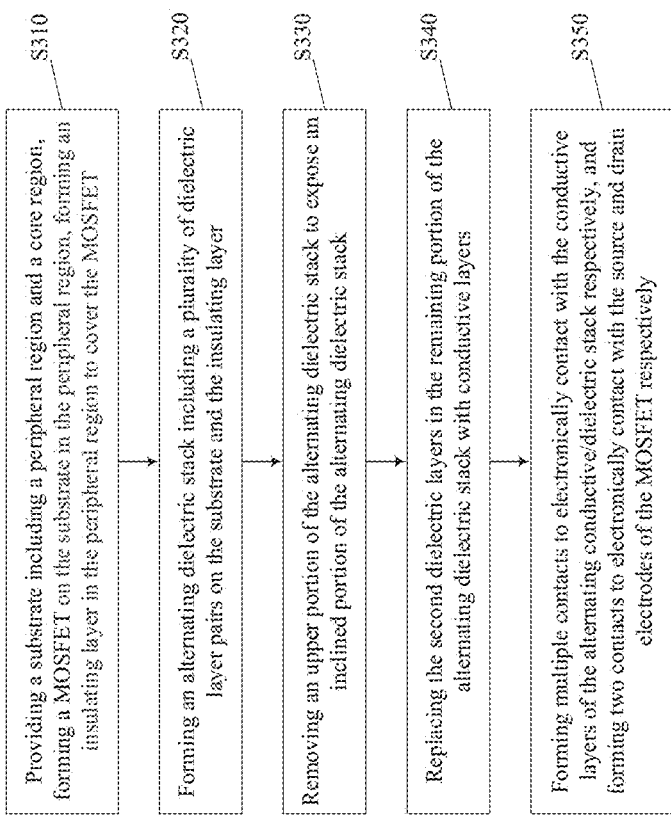
FIG. 3 illustrates a flow diagram of an exemplary method for forming a 3D memory device in accordance with some embodiments of the present disclosure.

FIG. 3 illustrates a flow diagram of an exemplary method for forming a 3D memory device in accordance with some embodiments of the present disclosure. FIGS. 4A-4H illustrate cross-sectional views of an exemplary 3D memory device at certain fabricating stages of the method shown in FIG. 3.

As shown in FIG. 3, the method can start at operation S310, in which a substrate including a peripheral region and a core region can be provided. A MOSFET can be formed on the substrate in the peripheral region. An insulating layer can be formed on the substrate in the peripheral region to cover the MOSFET.

Figure 4A:
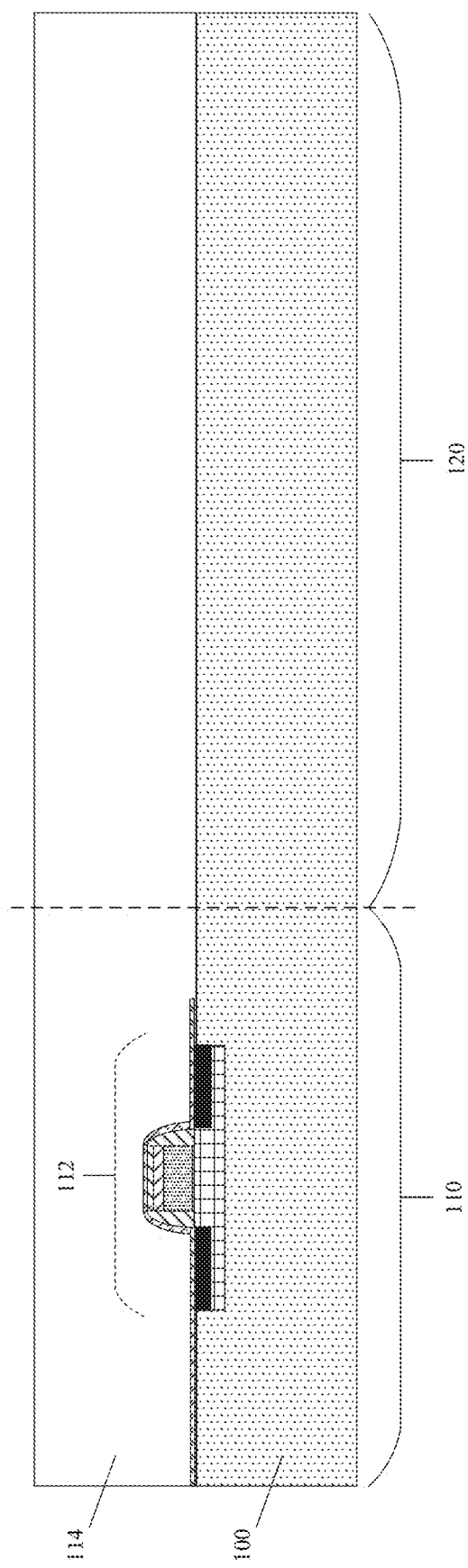

As shown in FIG. 4A, a substrate 100 can be provided. In some embodiments, substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc.

In some embodiments, substrate 100 can be divided into a peripheral region 110 and a core region 120. Peripheral region 110 can surround core region 120. As shown in FIG. 1A, in some embodiments, a metal-oxide-semiconductor field-effect transistor (MOSFET) 112 can be formed on substrate 100 in peripheral region 110.

Figure 4B:
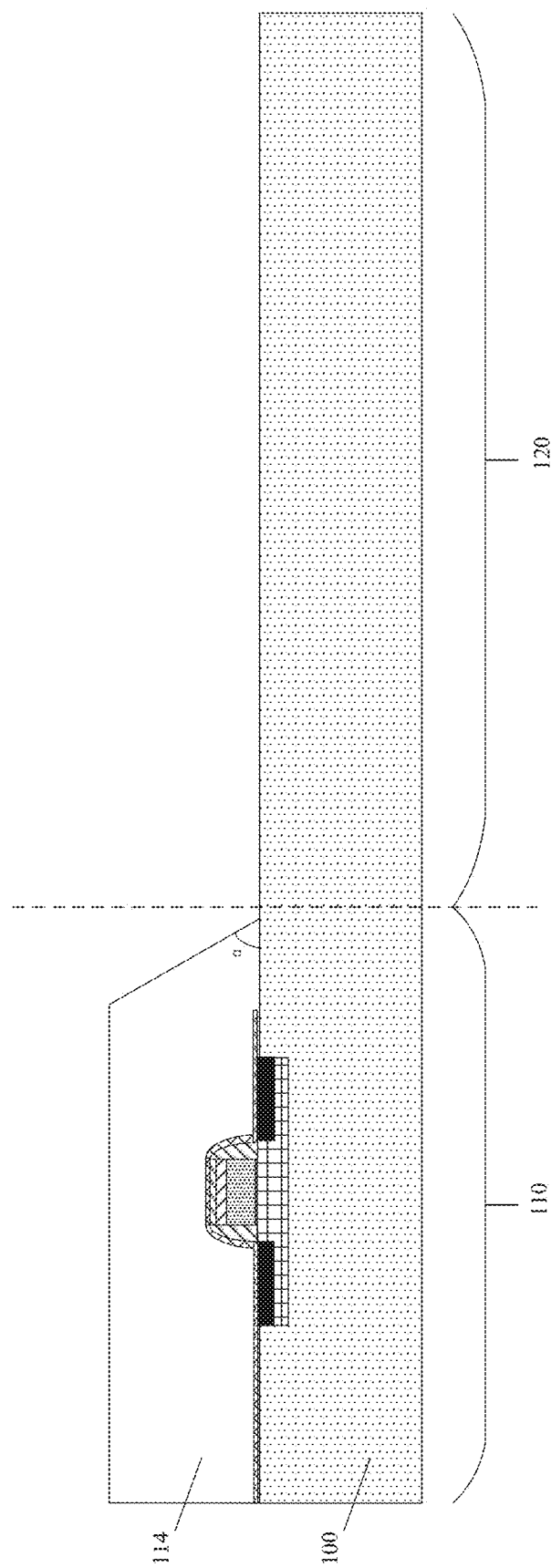

In some embodiments, an insulating layer 114 can be formed on substrate 100 in peripheral region 110 to cover MOSFET 112. Insulating layer 114 can include any suitable insulating material and/or dielectric material, such as silicon oxide, etc. In some embodiments, an oxide layer can be deposited on substrate 100 to cover MOSFET 112, as shown in FIG. 4A. A portion of the oxide layer in core region 120 can be etched and removed. For example, a hard mask etching process can be used to etch and remove the oxide layer in the core region. The remaining portion of the oxide layer in peripheral region 110 forms insulating layer 114, as shown in FIG. 4B.

In some embodiments, a thickness of peripheral region 110 in peripheral region 110 can be approximately equal to a thickness of an alternating dielectric stack formed in a subsequent process. Insulating layer 114 at the boundary of peripheral region 110 that is adjacent to core region 120 can have a slope, as shown in FIG. 4B. A slant angle of the slope a can be in a range between about 30 degrees and about 90 degrees, preferably equal to about 60 degrees. In some embodiments, within the size limitation of the peripheral region 110, the slant angle α of the slope can be as larger as possible.

It should be noted that, in the subsequent fabricating processes for forming the three-dimensional memory device, an inclined alternating layer stack can be formed on the slope of insulating layer 114 to replace the staircase structure described above in connection with FIGS. 1D-1F. The conductive layers in the inclined alternating layer stack can be used to connect to contacts. Thus, a larger slant angle of the slope a can ensure a larger distance between adjacent conductive layers in the inclined alternating layer stack, and a larger thickness of the conductive layers in the inclined alternating layer stack. Thus, the contacts can be easily formed to be in contact with corresponding conductive layers, thereby ensuring an electrical safety of the alternating layer stack.

Referring back to FIG. 3, the method can proceed to operation S320, in which an alternating dielectric stack including a plurality of dielectric layer pairs can be formed on the substrate and the insulating layer.

As shown in FIG. 4C, alternating dielectric stack 200 including a plurality of dielectric layer pairs can be formed on substrate 100 and insulating layer 114. Alternating dielectric stack 200 can include an alternating stack of a first dielectric layer 202 (e.g., of silicon oxide) and a second dielectric layer 204 (e.g., of silicon nitride) that is different from first dielectric layer. In core region 120, the plurality of first dielectric layers 202 and second dielectric layers 204 are extended in a lateral direction that is parallel to the surface of substrate 100. In peripheral region 110, the plurality of first dielectric layers 202 and second dielectric layers 204 can be extended along the surface of insulating layer 114. That is, at the boundary of peripheral region 110 and core region 120, an inclined portion of the plurality of first dielectric layers 202 and second dielectric layers 204 can be inclined at the slant angle α and extended along a direction that is parallel to the top surface of the slope of insulating layer 114.

In some embodiments, there are more layers than the dielectric layer pairs made of different materials and with different thicknesses in alternating dielectric stack 200. In some embodiments, a top layer of alternating dielectric stack 200 can be a second dielectric layer that has a thickness larger than the thicknesses of other interlayers. The top layer of alternating dielectric stack 200 can be used as a chemical mechanical polishing (CMP) stop layer 420 in core region 120. Similarly, a bottom layer of alternating dielectric stack 200 can be a second dielectric layer and can be used as a CMP stop layer 410 in peripheral region 110. CMP stop layer 410 in peripheral region 110 and CMP stop layer 420 in core region 120 can be approximately co-planar, as the level of the dashed line shown in FIG. 4C.

In some embodiments, alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, alternating dielectric stack 200 can include a plurality of oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in alternating dielectric stack 200, multiple oxide layers 202 and multiple nitride layers 204 alternate in a vertical direction. In other words, except a top and a bottom layer of a given alternating oxide/nitride stack, each of the other oxide layers 202 can be sandwiched by two adjacent nitride layers 204, and each of the other nitride layers 204 can be sandwiched by two adjacent oxide layers 202.

Oxide layers 202 can each have the same thickness or have different thicknesses. For example, a thickness of each oxide layer 202 can be in a range from 10 nm to 100 nm, preferably about 30 nm. Similarly, nitride layers 204 can each have the same thickness or have different thicknesses. For example, a thickness of each nitride layer 204 can be in a range from 10 nm to 100 nm, preferably about 35 nm.

It is noted that, in the present disclosure, oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, oxide layers 202 can be silicon oxide layers, and nitride layers 204 can be silicon nitride layer.

Alternating dielectric stack 200 can include any suitable number of layers of oxide layers 202 and nitride layers 204. In some embodiments, a total number of layers of oxide layers 202 and nitride layers 204 in alternating dielectric stack 200 is equal to or larger than 64. That is, a number of oxide/nitride layer pairs can be equal to or larger than 32. In some embodiments, alternating oxide/nitride stack 200 includes more oxide layers or more nitride layers with different materials and/or thicknesses than the oxide/nitride layer pair.

Referring back to FIG. 3, the method can proceed to operation S330, in which an upper portion of the alternating dielectric stack can be removed to expose the inclined portion of the alternating dielectric stack. In some embodiments, an upper portion of the alternating dielectric stack above CMP stop layer 410 can be removed by performing an etching back process, a chemical mechanical polishing (CMP) process, and a CMP stop layer removal process.

Figure 4D:
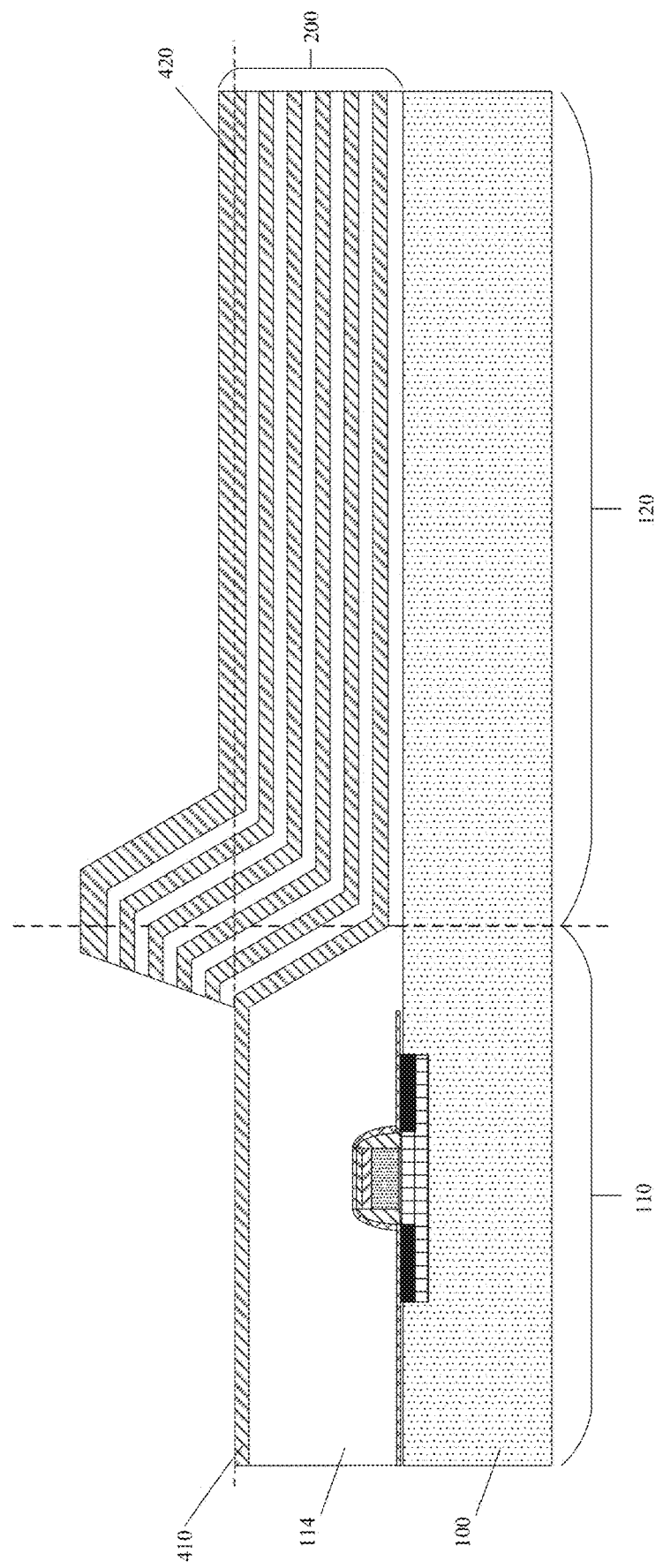

As shown in FIG. 4D, a portion of alternating dielectric stack 200 in peripheral region 110 can be removed by performing an etching back process. For example, a hard mask layer can be formed to cover the portions of alternating dielectric stack 200 in core region 120 and on the slope of insulating layer 114. An etching back process can be performed to remove first dielectric layers 202 and second dielectric layers 204 in peripheral region 110 that are not covered by the hard mask layer. The etching back process can stop at CMP stop layer 410.

Figure 4E:
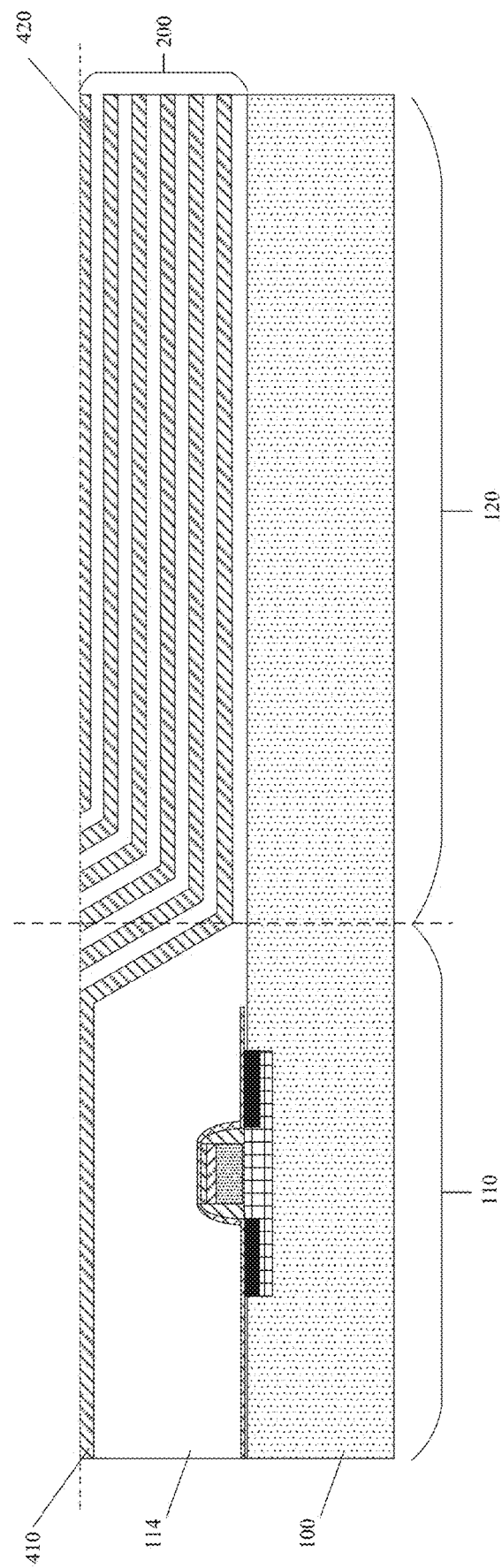

As shown in FIG. 4E, a chemical mechanical polishing (CMP) process can be performed to remove the raised portion of alternating dielectric stack 200 above the level of CMP stop layer 410 and CMP stop layer 420. As such, second dielectric layers 204 in the inclined portion of alternating dielectric stack 200 can be exposed, and a top surface of the inclined portion of alternating dielectric stack 200 can be planarized and co-planar with CMP stop layer 410 and CMP stop layer 420.

As shown in FIG. 4F, CMP stop layer 410 and CMP stop layer 420 can be then removed to expose the insulating layer in peripheral region 110 and top first dielectric layer 202 in core region 120. CMP stop layer 410 and CMP stop layer 420 can be removed by using any suitable process, such as a wet etching process. In some embodiments, when the thickness of alternating dielectric stack 200 in core region 120 is higher than the thickness of insulating layer 114 in peripheral region 110, some of the top layers of alternating dielectric stack 200 in core region 120 can also be removed.

Referring back to FIG. 3, the method can proceed to operation S340, in which the second dielectric layers in the remaining portion of the alternating dielectric stack can be replaced with conductive layers, such that the remaining portion of the alternating dielectric stack is converted to an alternating conductive/dielectric stack.

Figure 4G:
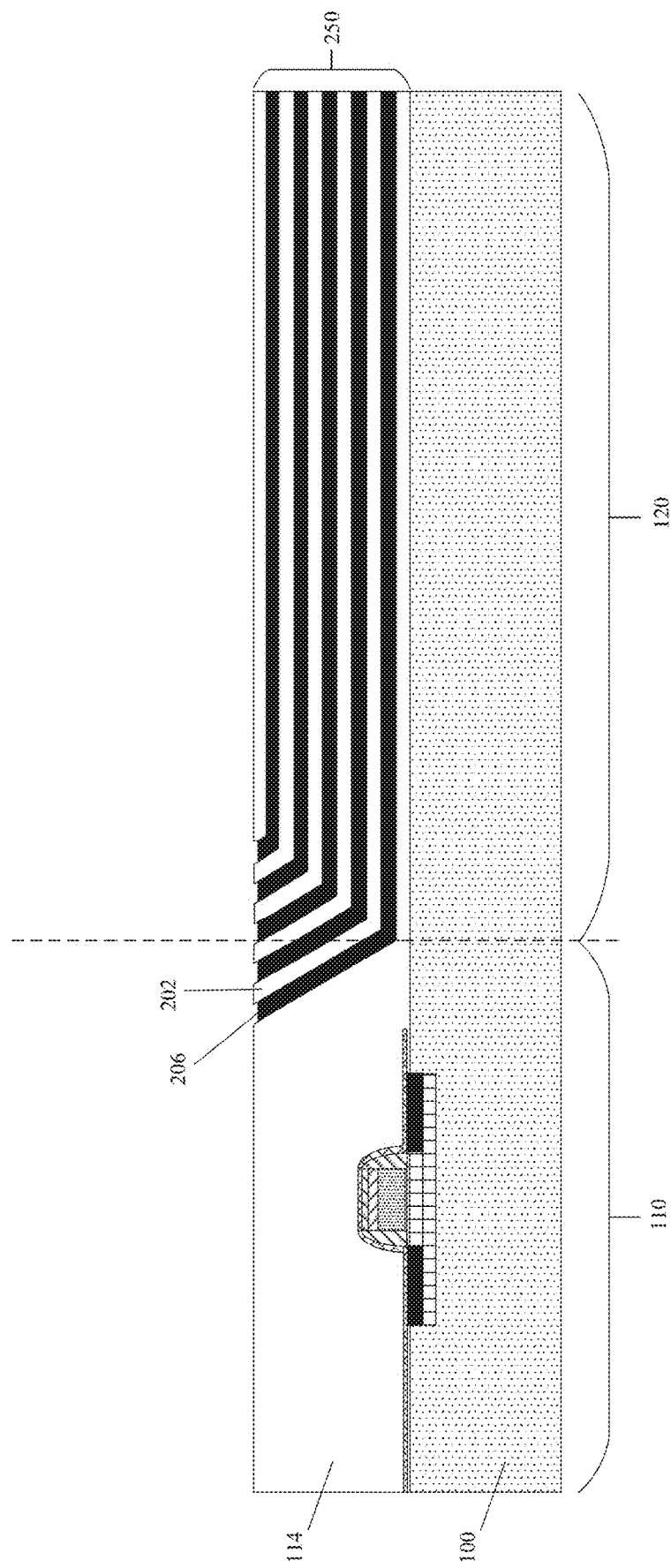

As shown in FIG. 4G, second dielectric layers 204 in alternating dielectric stack 200 can be replaced by conductive layers 206, such that alternating dielectric stack 200 is converted to an alternating conductive/dielectric stack 220. The alternating conductive/dielectric stack includes a lateral portion extended on the surface of substrate 100 in core region 120, and an inclined portion extended on the slope of insulating layer 114. Conductive layers 206 can be used as multiple word lines.

Specifically, a gate replacement process (also known as the "word line replacement" process) can be performed to replace second dielectric layers 204 (e.g., silicon nitride) of alternating dielectric stack 200 with conductive layers 206 (e.g., W). As a result, after the gate replacement process, alternating dielectric stack 200 can become an alternating conductive/dielectric stack 250. The replacement of second dielectric layers 204 with conductive layers 206 can be performed by wet etching second dielectric layers 204 (e.g., silicon nitride) selective to first dielectric layers 202 (e.g., silicon oxide) and filling the structure with conductive layers 206 (e.g., W). Conductive layers 206 can be filled by PVD, CVD, ALD, any other suitable process, or any combination thereof. Conductive layers 206 can include any suitable conductive materials including, but not limited to, W, Co, Cu, Al, polysilicon, silicides, or any combination thereof.

Referring back to FIG. 3, the method can proceed to operation S350, in which multiple contacts can be formed to electronically contact with the conductive layers of the alternating conductive/dielectric stack respectively, and two contacts can be formed to electronically contact with the source and drain electrodes of the MOSFET respectively.

Figure 4H:
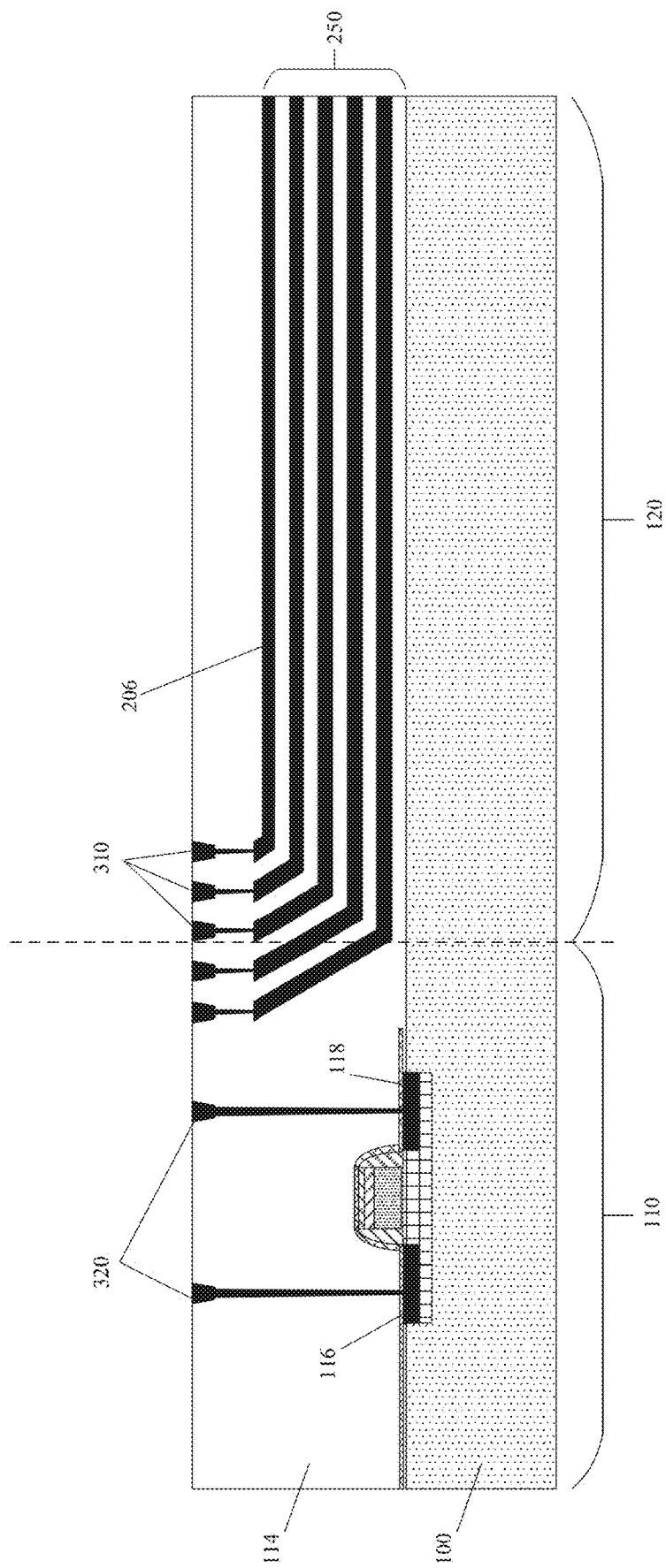

As shown in FIG. 4H, a height of insulating layer 114 can be increased to cover the alternating conductive/dielectric stack 250. In some embodiments, a deposition process can be performed to increase the height of insulating layer 114 in peripheral region 110 and core region 120, such that insulating layer 114 can cover the top surface of the inclined portion and the lateral portion of the alternating conductive/dielectric stack 250. A chemical mechanical polishing (CMP) process can be performed to planarize the top surface of insulating layer 114.

In some embodiments, multiple contacts 310 can be formed in insulating layer 114 to electrically contact with the inclined portions of multiple conductive layers 206 of the alternating conductive/dielectric stack 250 respectively. As such, the multiple word lines can be connected to a wiring layer through multiple contacts 310. Since the contacting surfaces of the inclined portions of multiple conductive layers 206 are co-planar, the lengths of multiple contacts 310 can equal to each other. That is, the inclined portions of the alternating conductive/dielectric stack 250 can be used to replace the staircase structure as shown in FIG. 1F.

In some embodiments, multiple contacts 310 can be formed through insulating layer 114 by first etching multiple vertical through holes (e.g., by wet etching and/or dry etching), followed by filling the through holes with conductive materials using ALD, CVD, PVD, any other suitable processes, or any combination thereof. The conductor materials used to fill the through holes can include, but are not limited to, W, Co, Cu, Al, polysilicon, silicides, or any combination thereof. It is understood that the process for forming multiple contacts 310 can include multiple processes, for example, photolithography, etching, thin film deposition, and CMP, etc.

As described above, since the contacting surfaces of the inclined portions of multiple conductive layers 206 are co-planar, the multiple vertical through holes can have a same depth. Therefore, the multiple vertical through holes can be formed by using a single etching process. Comparing to performing multiple etching processes to form multiple vertical through holes having different depths for the staircase structure, the above fabricating method has a simple process and has an improved efficiency.

In some embodiments, two contacts 320 can be formed in insulating layer 114 to electrically contact with source electrode 116 and drain electrode 118 of MOSFET 112 respectively.

Another aspect of the present disclosure provides a 3D memory device formed by using the disclosed method described above in connection with FIGS. 3 and 4A-4H. The 3D memory device can include an insulating layer on a substrate in a peripheral region. The insulating layer having a slope near a boundary between the peripheral region and a core region of the substrate. The 3D memory device can further include an alternating conductive/dielectric stack on the substrate and the slope of the insulating layer. A lateral portion of the alternating conductive/dielectric stack extending along a top surface of the substrate in the core region, and an inclined portion of the alternating conductive/dielectric stack extending along the slope of the insulating layer. A top surface of the lateral portion of the alternating conductive/dielectric stack is co-planar with a top surface of the inclined portion of the alternating conductive/dielectric stack.

The 3D memory device can further include a plurality of contacts in electrically contact with a plurality of conductive layers in the inclined portion of the alternating conductive/dielectric stack. The plurality of contacts can have a same height and are formed in a same process.

In some embodiments, the 3D memory device can further include a metal-oxide-semiconductor field-effect transistor on the substrate in the peripheral region that is covered by the insulating. Two contacts are in electrically contact with a source electrode and a drain electrode of the metal-oxide-semiconductor field-effect transistor respectively.

Accordingly, a 3D memory device and a fabricating method are disclosed. In the disclosed method, an alternating conductive/dielectric stack can include an inclined portion formed on a slope of an insulating layer. The inclined portion of the alternating conductive/dielectric stack can be used to replace the staircase structure. The contacting surfaces of the multiple conductive layers of the alternating conductive/dielectric stack can be at the inclined portion and co-planar with each other. Thus, multiple contacts can be formed in a single process to electronically contact with the multiple conductive layers. Without forming the staircase structure, multiple trim-etch processes are not necessary, the cost of multiple photoresist masks and etching processes can be saved. Moreover, the drawbacks including short problem, leakage problem and breakdown problem caused by the difficulty of controlling the staircase structure fabricating process can be avoided.

In some embodiments, the method comprises: forming an first insulating layer on a substrate in a peripheral region, the first insulating layer having a slope near a boundary between the peripheral region and a core region of the substrate; forming an alternating conductive/dielectric stack on the substrate and the slope of the first insulating layer, a lateral portion of the alternating conductive/dielectric stack extending along a top surface of the substrate in the core region, and an inclined portion of the alternating conductive/dielectric stack extending along the slope of the first insulating layer; and forming a plurality of contacts to electrically contact a plurality of conductive layers in the inclined portion of the alternating conductive/dielectric stack.

In some embodiments, the method further comprises: before forming the first insulating layer, forming a metal-oxide-semiconductor field-effect transistor on the substrate in the peripheral region; wherein forming the first insulating layer includes forming the first insulating layer to cover the metal-oxide-semiconductor field-effect transistor.

In some embodiments, forming the first insulating layer comprises: forming the first insulating layer on the substrate in both the peripheral region and the core region; and removing a portion of the first insulating layer in the core region, such that the remaining portion of the first insulating layer in the peripheral region has the slope near the boundary between the peripheral region and the core region.

In some embodiments, forming the first insulating layer comprises: forming the first insulating layer having a slope with a slant angle in a range from about 30 degrees to about 90 degrees.

In some embodiments, forming the alternating conductive/dielectric stack comprises: forming an alternating dielectric stack on the substrate and the first insulating layer, the alternating dielectric stack including a first lateral portion on the substrate in the core region, a second lateral portion on a top surface of the first insulating layer in the peripheral region, and an inclined portion on the slope of the first insulating layer near the boundary between the peripheral region and the core region; removing the second lateral portion of the alternating dielectric stack; planarizing a top surface of the inclined portion of the alternating dielectric stack, such that the top surfaces of the first insulating layer, the inclined portion of the alternating dielectric stack, and the first lateral portion of the alternating dielectric stack are co-planar; and converting remaining portions of the alternating dielectric stack to the alternating conductive/dielectric stack.

In some embodiments, forming the alternating dielectric stack comprises: forming at least 32 dielectric layer pairs stacked in a vertical direction above the substrate, each dielectric layer pair including a first dielectric layer and a second dielectric layer that has a material different with the first dielectric layer.

In some embodiments, forming the alternating dielectric stack comprises: forming at least 32 dielectric layer pairs stacked in the vertical direction, each dielectric layer pair including a silicon oxide layer and a silicon nitride layer.

In some embodiments, forming the alternating dielectric stack comprises: forming a bottom second dielectric layer on a top surface of the first insulating layer as a first chemical mechanical polishing stop layer in the peripheral region; and forming a top second dielectric layer as a second chemical mechanical polishing stop layer in the core region; wherein the first chemical mechanical polishing stop layer and the second chemical mechanical polishing stop layer are approximately co-planar.

In some embodiments, removing the second lateral portion of the alternating dielectric stack comprises: removing the first dielectric layers and the second dielectric layers of the alternating dielectric stack in the alternating dielectric stack except the bottom second dielectric layer.

In some embodiments, planarizing the top surface of the inclined portion of the alternating dielectric stack comprises:

removing an upper portion of the inclined portion of the alternating dielectric stack that is higher than a top surface of the first chemical mechanical polishing layer or the second chemical mechanical polishing stop layer.

In some embodiments, converting remaining portions of the alternating dielectric stack to the alternating conductive/dielectric stack comprises: replacing the second dielectric layers in the alternating dielectric stack with conductive layers.

In some embodiments, forming the plurality of contacts comprises: forming a second insulating layer in both the peripheral region and the core region to cover a top surface of the alternating conductive/dielectric stack; and forming a plurality of contacts in the second insulating layer to electrically contact with the plurality of conductive layers in the inclined portion of the alternating conductive/dielectric stack; wherein the plurality of contacts have a same height.

In some embodiments, forming the plurality of contacts comprises: forming a plurality of through holes in the second insulating layer in a single etching process; and depositing a conductive material into the plurality of through holes to form the plurality of contacts.

In some embodiments, the method further comprises: forming two contacts in the first and second insulating layers to electrically contact a source electrode and a drain electrode of the metal-oxide-semiconductor field-effect transistor respectively.

Another aspect of the present disclosure provides a three-dimensional (3D) memory device, comprising: an insulating layer on a substrate in a peripheral region, the insulating layer having a slope near a boundary between the peripheral region and a core region of the substrate; an alternating conductive/dielectric stack on the substrate and the slope of the insulating layer, a lateral portion of the alternating conductive/dielectric stack extending along a top surface of the substrate in the core region, and an inclined portion of the alternating conductive/dielectric stack extending along the slope of the insulating layer; and a plurality of contacts in electrical contact with a plurality of conductive layers in the inclined portion of the alternating conductive/dielectric stack.

The device further comprises: a metal-oxide-semiconductor field-effect transistor on the substrate in the peripheral region, wherein the insulating layer covers the metal-oxide-semiconductor field-effect transistor; and two contacts in the insulating layer and in electrical contact with a source electrode and a drain electrode of the metal-oxide-semiconductor field-effect transistor respectively.

In some embodiments, a slant angle of the slope of the insulating layer is in a range from about 30 degrees to about 90 degrees.

In some embodiments, the alternating conductive/dielectric stack comprises: at least 32 conductive/dielectric layer pairs, each including a dielectric layer and a conductive layer.

In some embodiments, a top surface of the lateral portion of the alternating conductive/dielectric stack is co-planar with a top surface of the inclined portion of the alternating conductive/dielectric stack.

In some embodiments, the plurality of contacts have a same height and are formed in a same process.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a first insulating layer on a substrate in a peripheral region, the first insulating layer having a slope near a boundary between the peripheral region and a core region of the substrate;
    forming an alternating conductive/dielectric stack on the substrate and the slope of the first insulating layer, a lateral portion of the alternating conductive/dielectric stack extending along a top surface of the substrate in the core region, and an inclined portion of the alternating conductive/dielectric stack extending along the slope of the first insulating layer, wherein forming the alternating conductive/dielectric stack comprises:
        forming an alternating dielectric stack on the substrate and the first insulating layer, the alternating dielectric stack including a first lateral portion on the substrate in the core region, a second lateral portion on a top surface of the first insulating layer in the peripheral region, and an inclined portion on the slope of the first insulating layer near the boundary between the peripheral region and the core region, wherein the alternating dielectric stack comprises a plurality of dielectric layer pairs each including a first dielectric layer and a second dielectric layer that has a material different than the first dielectric layer, a bottom second dielectric layer is formed on a top surface of the first insulating layer as a first chemical mechanical polishing stop layer in the peripheral region, and a top second dielectric layer is formed as a second chemical mechanical polishing stop layer in the core region,
        removing the first dielectric layers and the second dielectric layers of the second lateral portion of the alternating dielectric stack in the peripheral region except the bottom second dielectric layer,
        removing an upper portion of the inclined portion of the alternating dielectric stack that is higher than a top surface of the first chemical mechanical polishing layer or the second chemical mechanical polishing stop layer, planarizing a top surface of the inclined portion of the alternating dielectric stack, such that the top surfaces of the first insulating layer, the inclined portion of the alternating dielectric stack, and the first lateral portion of the alternating dielectric stack are co-planar, and converting remaining portions of the alternating dielectric stack to the alternating conductive/dielectric stack; and forming a plurality of contacts to electrically contact a plurality of conductive layers in the inclined portion of the alternating conductive/dielectric stack.

2. The method of claim 1, further comprising:

before forming the first insulating layer, forming a metal-oxide-semiconductor field-effect transistor on the substrate in the peripheral region;

wherein forming the first insulating layer includes forming the first insulating layer to cover the metal-oxide-semiconductor field-effect transistor.

3. The method of claim 1, wherein forming the first insulating layer comprises:

forming the first insulating layer on the substrate in both the peripheral region and the core region; and removing a portion of the first insulating layer in the core region, such that the remaining portion of the first insulating layer in the peripheral region has the slope near the boundary between the peripheral region and the core region.

4. The method of claim 1, wherein forming the first insulating layer comprises:

forming the first insulating layer having a slope with a slant angle in a range from about 30 degrees to about 90 degrees.

5. The method of claim 1, wherein forming the alternating dielectric stack comprises:

forming at least 32 dielectric layer pairs stacked in a vertical direction above the substrate.

6. The method of claim 5, wherein forming the alternating dielectric stack comprises:

forming at least 32 dielectric layer pairs stacked in the vertical direction, each dielectric layer pair including a silicon oxide layer and a silicon nitride layer.

7. The method of claim 5, wherein the first chemical mechanical polishing stop layer and the second chemical mechanical polishing stop layer are approximately co-planar.

8. The method of claim 5, wherein converting remaining portions of the alternating dielectric stack to the alternating conductive/dielectric stack comprises:

replacing the second dielectric layers in the alternating dielectric stack with conductive layers.

9. The method of claim 1, wherein forming the plurality of contacts comprises:

forming a second insulating layer in both the peripheral region and the core region to cover a top surface of the alternating conductive/dielectric stack; and forming a plurality of contacts in the second insulating layer to electrically contact with the plurality of conductive layers in the inclined portion of the alternating conductive/dielectric stack; wherein the plurality of contacts have a same height.

10. The method of claim 9, wherein forming the plurality of contacts comprises:

forming a plurality of through holes in the second insulating layer in a single etching process; and depositing a conductive material into the plurality of through holes to form the plurality of contacts.

11. The method of claim 2, further comprising:

forming two contacts in the first and second insulating layers to electrically contact a source electrode and a drain electrode of the metal-oxide-semiconductor field-effect transistor respectively.

* * * * *